United States Patent
Christopherson et al.

(10) Patent No.: US 6,360,425 B1
(45) Date of Patent: *Mar. 26, 2002

(54) TORSIONAL TEXTURING OF SUPERCONDUCTING OXIDE COMPOSITE ARTICLES

(75) Inventors: Craig John Christopherson, Grafton; Gilbert N. Riley, Jr., Marlborough; John Scudiere, Bolton, all of MA (US)

(73) Assignee: American Superconductor Corp., Westborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/302,601

(22) Filed: Sep. 8, 1994

(51) Int. Cl.$^7$ ............................................... H01L 39/24
(52) U.S. Cl. ........................ 29/599; 505/100; 505/230; 505/231
(58) Field of Search ............................ 29/599; 505/100, 505/230, 231

(56) References Cited

U.S. PATENT DOCUMENTS

| | | |
|---|---|---|
| 3,763,552 A | 10/1973 | Brown et al. |
| 4,093,817 A | 6/1978 | Jüngst et al. |
| 4,883,922 A | 11/1989 | Yokota et al. |

FOREIGN PATENT DOCUMENTS

| | | |
|---|---|---|
| EP | 0 503 525 | 9/1992 |

OTHER PUBLICATIONS

"The Dependence of Critical Current Density on Filament Diameter in Round Multifilament As–Sheathed $Bi_2Sr_2Ca_1Cu_2O_x$ Wires Processed in $O_2$" L. R. Motowidlo et al. *Appl. Phys. Lett.* 65, 2731–2733 (Nov. 21 1994); available in preprint form before Sep. 8, 1994.

(List continued on next page.)

*Primary Examiner*—Carl J. Arbes
(74) *Attorney, Agent, or Firm*—Elizabeth E. Nugent; Choate Hall & Stewart

(57) ABSTRACT

A method of texturing a multifilamentary article having filaments comprising a desired oxide superconductor or its precursors by torsionally deforming the article is provided. The texturing is induced by applying a torsional strain which is at least about 0.3 and preferably at least about 0.6 at the surface of the article, but less than the strain which would cause failure of the composite. High performance multifilamentary superconducting composite articles having a plurality of low aspect ratio, twisted filaments with substantially uniform twist pitches in the range of about 1.00 inch to 0.01 inch (25 to 0.25 mm), each comprising a textured desired superconducting oxide material, may be obtained using this texturing method. If tighter twist pitches are desired, the article may be heat treated or annealed and the strain repeated as many times as necessary to obtain the desired twist pitch. It is preferred that the total strain applied per step should be sufficient to provide a twist pitch tighter than 5 times the diameter of the article, and twist pitches in the range of 1 to 5 times the diameter of the article are most preferred. The process may be used to make a high performance multifilamentary superconducting article, having a plurality of twisted filaments, wherein the degree of texturing varies substantially in proportion to the radial distance from the center of the article cross-section, and is substantially radially homogeneous at any given cross-section of the article. Round wires and other low aspect ratio multifilamentary articles are preferred forms. The invention is not dependent on the melting characteristics of the desired superconducting oxide. Desired oxide superconductors or precursors with micaceous or semi-micaceous structures are preferred. When used in connection with desired superconducting oxides which melt irreversibly, it provides multifilamentary articles that exhibit high DC performance characteristics and AC performance markedly superior to any currently available for these materials. In a preferred embodiment, the desired superconducting oxide material is BSCCO 2223.

34 Claims, 7 Drawing Sheets

OTHER PUBLICATIONS

"Effects of Processing, Heat Treatment Tempertur (sic) and Starting Powders on the Critical Densities of Ag–Sheathed BiPbSrCaCuO Wires and Tapes" X. Zhengping et al. (preprint).

"Development of Practical High Temperature Superconducting Wire for Electrical Power Applications" R. A. Hawsey et al. Abstract 022–WCS4, presented at 4th International Conference and Exhibition of the World Congress on Superconductivity, Orlando Florida, Jun. 27–Jul. 1, 1994.

"Effect of Thermomechanical Treatment on the Critical Current Density of Ag–Sheathed B(Pb)SCCO Tapes" K. Osamura et al. *Supercond. Sci. Technol.* 3, 143–147 (1990).

"Mechanical and Electrical Properties of BSCCO Multifilament Tape Conductors" L.R. Motowidlo et al. presented at Materials Research Society Meeting, San Francisco, CA, Apr. 12–15, 1993.

"Development of Technical High–$T_c$ Superconductor Wires and Tapes" J. Tenbrink et al. Paper MF–1, Applied Superconductivity Conference, Chicago, IL, Aug. 23–28, 1992.

"Critical Transport Currents and Microstructure in Textured and Untextured $(Bi,Pb)_2Sr_2Ca_2Cu_3O_x$ Wires" M. Ullrich et al. presented at the 6th International Workshop on Critical Currents, Cambridge, England, Jul. 8–11, 1991.

"Dependence of the Angular Anisotropy of the Critical Current Density on Texture in Silver–Sheathed Bi–2223 Tapes" J.O. Willis et al. Paper No. CV–3, International Cyrogenic Materials Conference, Albuquerque, NM Jul. 12–16, 1993.

"Critical Issues in the OPIT of Higj–$J_c$ BSCCO Superconductors" K. H. Sandhage et al. *JOM* 43(3), 21–25 (Mar. 1991).

"Preparation of the Textured Bi Based Oxide Tapes by Partial Meeting" Kase et al., *IEEE* 27(2), 1254 (Mar. 1991).

"Time Varying Fields and A.C. Losses" Wilson, *Superconducting Magnets* Ch. 8 (1983, 1990).

"Textured BSCCO/Ag Superconducting Microcomposites with Improved Critical Current Density through Mechanical Deformation" Gao and Vander Sande *Superconducting Science amd Technology* 5, 318–326 (1992).

Rosner et al. "Status of HTS Superconductors: Progress in improving transport critical current densities in HTS Bi–2223 tapes and coils", presented at conference 'Critical Currents in High $T_c$ Superconductors' Vienna, Austria (Apr. 1992).

"Influence of thermomechanical treatment of critical currents in Ag–sheathed BSCCO–2223 tapes" D.J. Bauer et al. *Cryogenics* 32(11), 1052–1055 (1992).

TORSIONAL TEXTURING OF SUPERCONDUCTING OXIDE COMPOSITE ARTICLES

GOVERNMENT RIGHTS IN INVENTION

This invention was made under Cooperative Agreement No. HTSPC-001 (subcontract 86X-SK700V) with Martin Marietta Energy Systems, Inc. acting under contract DE-AC05-84OR21400 with the Department of Energy. The Government has certain rights in this invention.

BACKGROUND OF THE INVENTION

1. Field of the Invention

This invention relates to superconducting oxide articles having improved characteristics for alternating current operation and to a method for manufacturing them. In particular, the invention relates to superconducting composite wires including tightly twisted filaments of a superconducting oxide material and to a manufacturing method which includes torsional deformation.

2. Background of the Invention

The geometries in which high-performance superconducting oxide composites may be successfully fabricated are constrained by the necessity of texturing the material to achieve adequate critical current density. The current-carrying capacity of a superconducting oxide composite depends significantly on the degree of crystallographic alignment and intergrain bonding of the oxide grains, together known as "texturing", induced during the composite manufacturing operation.

Known processing methods for texturing superconducting oxide composite articles include various forms of heat treatment as well as longitudinal deformation. Certain superconducting oxide grains can be oriented along the direction of an applied strain, a phenomenon known as deformation-induced texturing (DIT). Longitudinal deformation techniques like pressing, drawing and rolling have been used to induce grain alignment of the oxide superconductor c-axis perpendicular to the plane or direction of elongation. Heat treatment under conditions which at least partially melt and regrow desired superconducting phases may promote texturing by enhancing the anisotropic growth of the superconducting grains, a phenomenon known as reaction-induced texturing (RIT).

However, not all texturing methods are equally applicable to, or effective for, all superconducting oxides. Most of these materials have very few known effective texturing mechanisms. For example, known techniques for texturing the two-layer and three-layer phases the bismuth-strontium-calcium-copper-oxide family of superconductors (BSCCO 2212 and BSCCO 2223, respectively) are described in Tenbrink, Wilhelm, Heine and Krauth, Development of Technical High-Tc Superconductor Wires and Tapes, Paper MF-1, Applied Superconductivity Conference, Chicago (Aug. 23–28, 1992), and Motowidlo, Galinski, Hoehn, Jr. and Haidar, Mechanical and Electrical Properties of BSCCO Multifilament Tape Conductors, paper presented at Materials research Society Meeting, Apr. 12–15, 1993. Techniques for manufacturing multifilamentary articles with sufficient texturing to provide acceptable critical current densities from BSCCO 2223 are presently limited to the production of highly aspected forms such as tapes.

The effectiveness of a particular DIT technique will depend on how closely the applied strain vectors correspond to the slip planes in the superconducting oxide. Thus, superconducting oxides such as the BSCCO family, which have a micaceous structure characterized by highly anisotropic preferred cleavage planes and slip systems, are known to be most effectively DIT textured by non-axisymmetric techniques such as pressing and rolling, which create highly aspected (greater than about 5:1) forms. For perovskite structures like the 123 phase of the yttrium-barium-copper-oxide (YBCO) family, which lack preferred cleavage planes and slip systems, longitudinal deformation is generally less effective in improving critical current density and the differences in texturing obtainable by axisymmetric and non-axisymmetric techniques are less pronounced.

Materials which exhibit peritectic melting can be effectively textured in a variety of geometries by melt textured growth, an RIT technique. Peritectic decomposition and the reformation of the oxide superconductor from the liquid+ (other) solid phase is the basis for melt textured growth of the two-layer phases of the bismuth-strontium-calcium-copper-oxide family of superconductors(BSCCO-2212) in round wire and tape forms, as described, for example, in Kase et al, IEEE TransMag 27(2), 1254(March 1991). Because 2212 totally melts and reforms during melt-textured growth, the texturing induced by deformation prior to the melting will not influence the final structure.

However, some of the most promising superconducting oxides, such as BSCCO 2223, cannot be effectively textured by the melt-textured growth technique. Instead of peritectic melting, BSCCO 2223 exhibits irreversible melting in that solid 2223 does not form directly from a liquid of 2223 composition. RIT techniques applicable to BSCCO 2223 have been described, for example in U.S. patent applications Ser. No. 08/041,822 filed Apr. 1, 1993, entitled "Improved Processing for Oxide Superconductors," and Ser. No. 08/198,912 filed Feb. 17, 1994, entitled "Improved Processing of Oxide Superconductors". The basis of such techniques is some type of partial melting, such as eutectic melting, solid solution melting or formation of non-equilibrium liquids, in which the oxide superconductor coexists with a liquid phase rather than being totally decomposed. However, such techniques are inherently more dependent on the geometry of the initial phase than melt-textured growth, and texturing induced by deformation prior to the partial melting will have a significant impact on the texturing of the final product. The RIT technique described in U.S. patent application Ser. No. 08/041,822 cited above, for example, has been observed to provide the greatest improvement in the Jc's of BSCCO 2223 samples when used in combination with a highly non-axisymmetric DIT technique, rolling. In short, superconducting oxides with irreversible melting characteristics such as BSCCO 2223 can be adequately textured by known techniques in highly aspected forms such as tapes, but scalable methods for manufacturing round wires and other low aspect ratio composite multifilamentary articles with sufficient texturing to provide acceptable critical current densities are not presently available.

This limitation has considerable commercial significance. Many of the superconductor applications that have the greatest potential for energy conservation involve operating the superconductor in the presence of an AC magnetic field, or require that the superconductor carry an AC current. In the presence of time-varying magnetic fields or currents, there are a variety of mechanisms that give rise to energy dissipation, hereafter called AC losses, even in superconductors. Thus, the superconductor geometry must be selected to reduce AC losses, in order to preserve the intrinsic advantage of superconductors, the absence of DC electrical resistance. The physics governing AC losses in low temperature superconducting composite materials have been described and analyzed, c.f. Wilson, *Superconducting Magnets*, Ch 8(1983, 1990), and round, multifilamentary composite geometries with twisted, low aspect ratio superconducting filaments have been demonstrated to have significantly better AC loss characteristics than highly aspected, untwisted or monofilamentary forms. To minimize hysteretic losses, the superconductor must preferably be subdivided into many small filaments that are dimensionally uniform and discrete along the length of the conductor. Low aspect ratio filaments (about 4:1 or less) will have lower hysteretic losses in all but unidirectional magnetic fields, so these filament dimensions are generally preferred. To minimize eddy current losses, the matrix resistivity must preferably be increased and the twist pitch of the filaments must preferably be tightened, i.e., reduced. Electrical properties which are radially homogeneous, that is homogenous around the circumference at any given cross-sectional radius, and are also homogeneous along the length of the article are preferred to assure uniform performance. In order to achieve this, it is desirable for both the distribution of the filaments and the degree of texturing to be substantially uniform along these dimensions. Homogeneous properties along the cross-sectional diameter are not required. In fact, for many AC applications electrical performance characteristics which are much poorer at the center of the cross-section than near the circumference may be preferred to reduce longitudinal eddy currents. In general, the primary sources of AC loss in low temperature superconducting composites, hysteretic loss within the superconducting filament(s),and eddy current loss in the noble metal matrix enhanced by coupling between superconducting filament(s), would be expected to operate in superconducting oxide composites with similar geometries. However, no conventional DIT or RIT texturing technique provides increased texture with increasing distance from the center of the article. In fact, the non-axisymmetric longitudinal deformations conventionally used to texture BSCCO 2223 provide a texturing distribution which is radially non-uniform and highest at the center of the article, an unfortunate distribution for AC loss minimization. The availability of round, multifilamentary BSCCO-2223 composites with suitably textured, low aspect ratio, tightly twisted filaments would be highly desirable for AC applications, and would substantially increase the prospects for near-term commercialization of this material.

Thus, an object of the invention is to provide a novel method of texturing multifilamentary articles comprising superconducting oxides and their precursors to provide improved AC loss characteristics without compromising critical current density.

Another object of the invention is to provide a high performance multifilamentary superconducting article wherein the degree of texturing is substantially radially homogeneous at any given cross-section of the article and varies substantially in proportion to the radial distance from the center of the article cross-section.

Another object of this invention is to provide a method of texturing multifilamentary superconducting composite articles with low aspect ratio filaments which is suitable for use with superconducting oxides which melt irreversibly.

Another object of the invention is to provide round twisted multifilamentary BSCCO 2223 composite conductors having high current densities and robust mechanical properties, and a method for producing them.

SUMMARY OF THE INVENTION

In one aspect, the invention provides a method of texturing a multifilamentary article having filaments comprising a desired oxide superconductor or its precursors by torsionally deforming the article. By "texturing", as that term is used herein, is meant inducing crystallographic alignment and intergrain bonding of the grains of a desired superconducting oxide or its precursors. Desired oxide superconductors or precursors with micaceous or semi-micaceous structures are preferred. The texturing is induced by applying a torsional strain which is at least about 0.3 and preferably at least about 0.6 at the surface of the article, but less than the strain which would cause failure of the composite. By failure of the composite, as this term is used herein, is meant breakdown of composite material, substantial loss of dimensional uniformity, or failure of the bonds between the filaments and the matrix material. It is preferred that the total strain applied should be sufficient to provide a twist pitch tighter than 5 times the diameter of the article at the time the strain is applied, and twist pitches in the range of 1 to 5 times the diameter of the article are most preferred. If tighter twist pitches are desired, the article may be heat treated or annealed and the torsional texturing step may be repeated as many times as necessary to obtain the desired twist pitch. Strains of this magnitude will provide twist pitches in the range of about 1.00 to 0.01 inch (25 to 0.25 mm), that is, about 1.00 to 80 twists per inch, for articles with diameters in the preferred range of 0.005 inch to 0.12 inch (0.13 to 3 mm) at the time the torsional strain is applied.

Preferably, the article is textured by applying a sequence of separate texturing steps including both torsional strains and conventional texturing techniques selected from the set including axisymmetric longitudinal deformation, isostatic pressing or roller straightening and RIT techniques dependent on partial melting. Any conventional technique which does not eliminate prior texturing or substantially change the aspect ratio of the article may be used. Preferably, at least one torsional deformation step precedes the first conventional texturing step. In the most preferred embodiment, one or more successive iterations of torsional and axisymmetric longitudinal deformation may be used, and heat treatments sufficient to produce RIT, phase transformation of precursors, or both, in the filament material are most preferably done after each deformation step except the last.

In another aspect, the invention provides a method for manufacturing a high performance multifilamentary superconducting article, such as a composite wire, having a plurality of low aspect ratio twisted filaments, each comprising a textured desired superconducting oxide material and, preferably, a noble metal matrix in intimate contact with said filaments. The process comprises the steps of forming a composite comprising a plurality of filaments of material comprising a desired superconducting oxide or its precursors, and preferably selected to have a micaceous or semi-micaceous structure, torsionally deforming the composite as described above in order to twist the filaments and texture the material comprised therein, and thermomechanically processing the composite at conditions sufficient to produce at least one of the effects of RIT, crack healing and, if a precursor material remains, phase transformation in the filament materials. Preferably, as described above, the article is textured by applying a sequence of separate texturing steps including both torsional strains and conventional texturing techniques selected from the set including axisymmetric longitudinal deformation, isostatic pressing or roller straightening and RIT techniques dependent on partial melting.

In yet another aspect, the invention provides a high performance multifilamentary superconducting article, having a plurality of low aspect ratio (preferably less than about 4:1) twisted filaments, each comprising a textured desired superconducting oxide material, and, preferably, a noble metal matrix in intimate contact with said filaments. It is preferred that the desired oxide superconductor or its precursors be selected to have a micaceous or semi-micaceous structure. Micaceous structures are characterized by highly anisotropic preferred cleavage planes and slip systems, and semi-micaceous structures are characterized by a highly anisotropic, plate-like structure but poorly defined cleavage planes and slip systems. This invention is particularly well adapted for use with micaceous desired superconducting oxides which melt irreversibly, such as BSCCO 2223. By "desired oxide superconductor", as that term is used herein, is meant the oxide superconductor intended for eventual use in the finished article. Typically, the desired oxide superconductor is selected for its superior electrical properties, such as high critical temperature or critical current density. By "precursor", as that term is used herein, is meant any material that can be converted to an oxide superconductor upon application of a suitable heat treatment. By "noble metal", as that term is used herein, is meant a metal which is substantially non-reactive with respect to oxide superconductors and precursors and to oxygen under the expected conditions (temperature, pressure, atmosphere) of manufacture and use. By "matrix" as that term is used herein, is meant a material or homogeneous mixture of materials which supports or binds a substance disposed within or around the matrix. "Alloy" is used herein to mean an intimate mixture of substantially metallic phases or a solid solution of two or more elements. Silver and alloys comprising silver are the preferred noble metal matrix materials, but other metals and alloys may be used.

In yet another aspect, the invention provides an elongated high performance multifilamentary superconducting article with improved AC loss characteristics. The article comprises a plurality of twisted filaments with substantially uniform dimensions along the length of the article, each filament at a given radial distance from the center of the article cross-section having a uniform dimension parallel to the radius and comprising a textured desired superconducting oxide material wherein the degree of texturing increases with the radial distance from the center of the article cross-section, and is substantially radially homogeneous at any given cross-section of the article. Round wires and other low aspect ratio multifilamentary articles are preferred forms. The invention is not dependent on the melting characteristics of the desired superconducting oxide. When used in connection with desired superconducting oxides which melt irreversibly, it provides multifilamentary articles that exhibit high DC performance characteristics and AC performance markedly superior to any currently available for these materials. In a preferred embodiment, the desired superconducting oxide material is BSCCO 2223.

DETAILED DESCRIPTION OF THE PREFERRED EMBODIMENTS

Figure 1A:
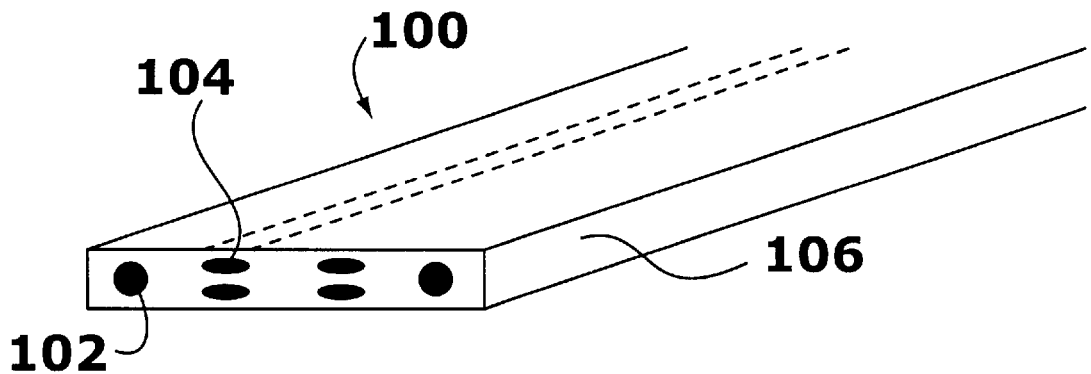
FIGS. 1(a) and (b) are schematic diagrams of the cross-sections of conventional BSCCO 2223 multifilamentary composite tapes in untwisted and twisted forms, respectively, and FIGS. 1(c) and (d) are schematic diagrams of the cross-sections of two advanced BSCCO 2223 multifilamentary composite wires with low-aspect ratio twisted filaments textured in accordance with the invention.

The present invention provides a method of texturing a multifilamentary article having a plurality of filaments of a desired oxide superconductor or its precursors, preferably selected from those which have a micaceous or semi-micaceous structure, by torsionally deforming the article. Although long twist pitches have been demonstrated in superconducting multifilamentary articles textured by conventional means, such as the highly aspected BSCCO tapes shown in European patent application 0503525A1, filed Mar. 9, 1992 by Knaak and Jahnke, torsioning to the tight twist pitches necessary to obtain texturing of superconducting oxides and their precursors represents a novel approach that has not previously been investigated. Even though torsional deformation does not induce longitudinal deformation or uniform compaction, the factors which have been associated with successful texturing in the past, it has been found to provide the significant improvements in critical current density associated with successful texturing. Unlike known deformation texturing techniques, the degree of texturing achievable by this method in filaments having a uniform dimension parallel to the radius at a given radial distance from the center of the article cross-section and substantially uniform dimensions along the length of the article, increases with the radial distance from the center of the article cross-section but is radially homogeneous, that is, homogenous around the circumference at any given cross-sectional radius, and may also be made substantially homogeneous along the length of the article. Thus, both well-textured, twisted filaments and the texturing distribution preferred for AC operation are easily obtainable using torsional texturing.

Although the invention may be used to texture any article comprising filaments of a superconducting oxide or its precursors, it is particularly well-adapted for texturing multifilamentary composites comprising filaments of these materials in intimate contact with a noble metal matrix, such as those produced using the well-known powder in tube (PIT) process. Composites of superconducting oxide materials in intimate contact with a noble metal matrix are desirable because they offer better mechanical properties than the brittle superconducting oxides alone can provide. The matrix material selected must be readily formable and must be non-reactive with respect to the superconducting material so that the latter's properties are not degraded in its presence. By "noble metal", as that term is used herein, is meant a metal which is substantially non-reactive with respect to oxide superconductors and precursors and to oxygen under the expected conditions (temperature, pressure, atmosphere) of manufacture and use. Preferred noble metals include silver (Ag), gold (Au), platinum (Pt), palladium (Pd) and alloys of these metals. Silver and its alloys, including oxide dispersion strengthened (ODS) silver, are lowest cost, and therefore most preferred for large-scale manufacturing.

The invention is preferably practiced with micaceous or semi-micaceous forms of any desired oxide superconductor or its precursors. By "desired oxide superconductor" is meant the oxide superconductor intended for eventual use in the finished article. Typically, the desired oxide superconductor is selected for its superior electrical properties, such as high critical temperature or critical current density. The desired oxide superconductor is typically that member of a superconducting oxide family which has demonstrated the best innate electrical properties, for example, BSCCO 2223 in the BSCCO family. By "precursor" is meant any material that can be converted to an oxide superconductor upon application of a suitable heat treatment. Precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor. For example, there may be included elements, salts, or oxides of copper, yttrium, and barium for the YBCO family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

The invention is applicable to any desired superconducting oxide which is in itself micaceous or semi-micaceous, or which has micaceous or semi-micaceous precursors. A micaceous structure is characterized by highly anisotropic preferred cleavage planes and slip systems. Semi-micaceous structures are characterized by a highly anisotropic, plate-like structure but poorly defined cleavage planes and slip systems. The BSCCO family of oxide superconductors are examples of micaceous forms and the TBSCCO family of oxide superconductors, and the HBSCCO family of oxide superconductors are examples of semi-micaceous structures. Micaceous or semi-micaceous precursors of a desired oxide superconductor may also be used, such as BSCCO 2212 precursors, which are micaceous, when the desired oxide superconductor is BSCCO 2223.

Figure 1B:
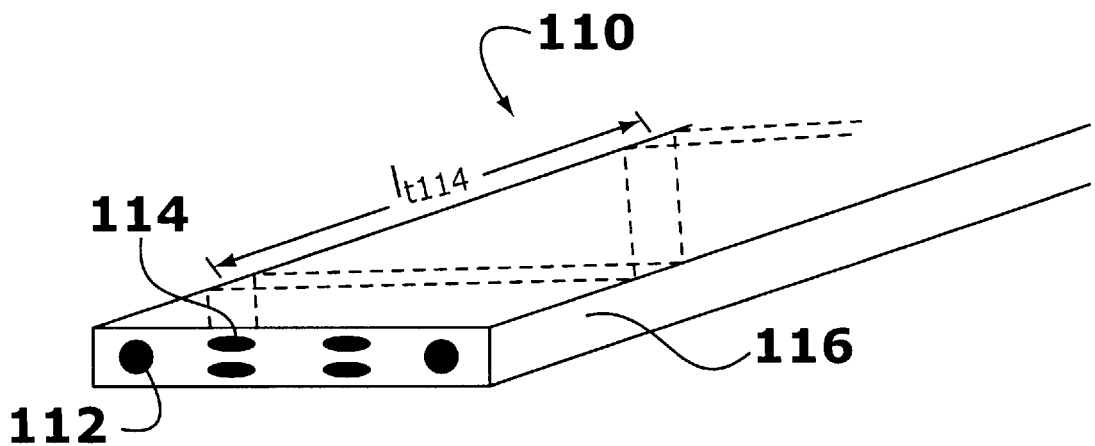

The three-layer, high-Tc phase of a member of the BSCCO family of superconductors (BSCCO 2223), such as $Bi_2Sr_2Ca_2Cu_3O_x$ or $(Bi, Pb)_2Sr_2Ca_2Cu_3O_x$, is the desired superconducting oxide most preferred for the operation of the present invention. Composites including BSCCO 2223 have demonstrated the potential for superior mechanical and electrical performance at long lengths when adequately textured. However, as previously mentioned, BSCCO 2223 melts irreversibly, and known techniques for texturing BSCCO 2223 are limited. For prior art BSCCO 2223 multifilamentary composite conductors, optimum texturing results have been obtained using an iterative thermomechanical process, in which 'D' signifies a longitudinal non-axisymmetric deformation (rolling, for example), 'S' signifies a high-temperature anneal near or within the stability field of the 2223 phase (~835 C in air), and 'n' refers to the number of 'DS' iterations. It is only through this type of a process that the superconducting phase has been textured to the degree necessary to assure high-performance. FIGS. 1(a) and (b) are schematic diagrams of the cross-sections of conventional BSCCO 2223 multifilamentary composite tapes available today in, respectively, an untwisted form, and a twisted form. In FIG. 1(a), untwisted tape 100 is composed of a plurality of superconducting oxide filaments, 102, 104 in intimate contact with a noble metal matrix 106. In FIG. 1(b), twisted tape 110, which may be made, for example as disclosed in European patent application 0503525A1, filed Mar. 9, 1992 by Knaak and Jahnke, is composed of a plurality of twisted filaments 112, 114 in intimate contact with a noble metal matrix 116. As a consequence of the nonaxisymmetric longitudinal deformation, a typical prior art high-performance BSCCO 2223 conductor has a high aspect ratio (width-to-thickness, often about 10:1) as shown in FIGS. 1(a) and (b), and contains flattened filaments with high aspect ratios. As taught in Knaak and Jahnke, the twist pitch, $I_{t114}$, of filament 114 shown in 1(b) is significantly larger than the dimensions of the tape 110. For large twist pitches, the AC losses in a highly aspected tape are increased over the losses from a round wire of equal cross-sectional area by (to a zero order approximation) the square root of the tape's aspect ratio. Thus, a tape with a 9:1 aspect ratio will have about 3 times the losses of a round wire of equal cross-sectional area. The high aspect ratios of filaments 112 and 114 in FIG. 1(b) also cause increased hysteretic losses in transverse magnetic fields. If, as is typical, the tape is obtained by deforming a round billet, filaments of equal dimension will also be non-uniformly flattened by the texturing process, with significantly greater flattening and DIT texturing of filament 114 at the center of the tape than of filament 112 at the periphery of the tape and non-uniform distances between filaments causing undesirable asymmetries in current carrying capability and additional AC loss effects.

Figure 1C:
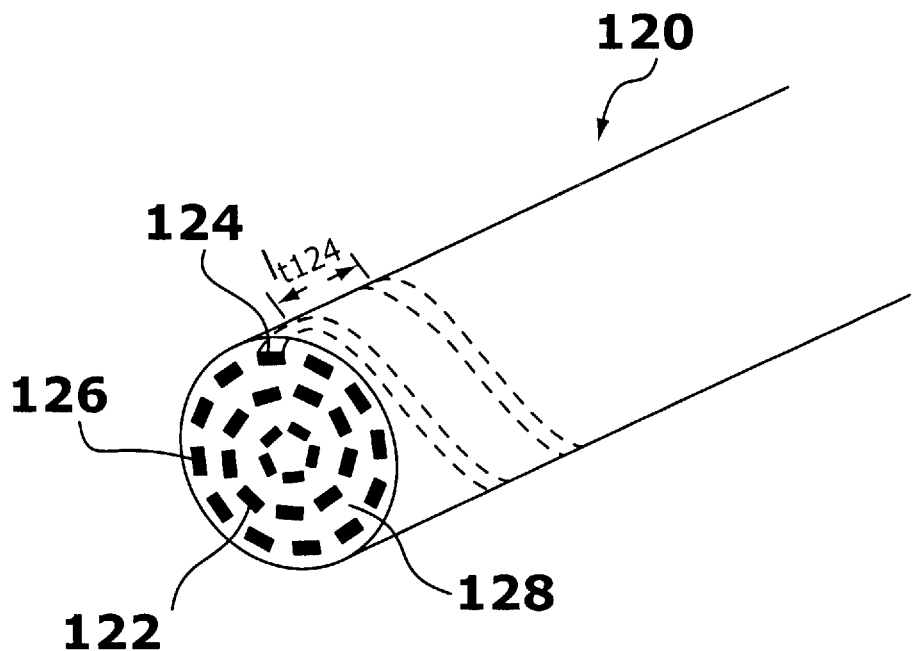
Figure 1D:
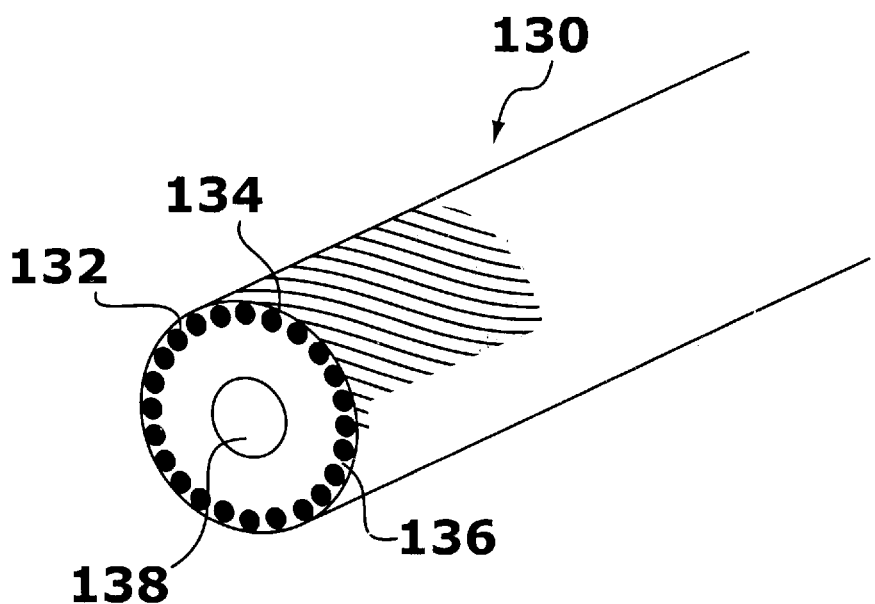

Round wires and other low aspect ratio composite forms, including multiple fine, highly textured and tightly twisted low aspect ratio filaments of BSCCO 2223 cannot be easily manufactured by conventional means. In accordance with the present invention, an improved texturing process is performed with selective use of torsional deformation so that simultaneous twisting and texturing may be imparted to filaments of BSCCO 2223 or its precursors while maintaining a low aspect ratio cross-section. FIGS. 1(c) and (d) illustrate advanced multifilamentary BSCCO 2223 composites with low aspect ratio twisted filaments manufactured in accordance with preferred embodiments of the invention. Round wires, a preferred embodiment of the invention, are shown, but any article which has a low aspect ratio , preferably less than about 4:1 in one cross-section, for example low aspect ratio rectangular or square magnet tapes, may be manufactured and textured in accordance with the invention. The round wire, 120 shown in FIG. 1(*c*) comprises a plurality of superconducting oxide filaments 122, 124,126 in intimate contact with a noble metal matrix 128. Fill factors over 0.1 are preferred. Filament counts of 6–10,000 are preferred and filament counts of 25–1,000 are most preferred. Filaments with a low aspect ratio, preferably not more than about 4:1, are preferred Rectangular filaments are shown in FIG. 1(*c*) and round ones in FIG. 1(*d*) but any low aspect ratio cross-section, such as hexagonal, octagonal, or trapezoidal, may equally be used. In accordance with the invention, the total twist pitch, $I_{t124}$, of filament 124 is no more than five times the cross-sectional diameter of the article 120. Filaments 124 and 126, having a substantially uniform dimension parallel to the radius and being at substantially the radial distance from the center of the article cross-section, are substantially equally textured. However, filament 122, being of substantially the same dimension but located closer to the center of the article cross-section than filaments 124 and 126, will be less textured and therefore have less current carrying capability. This is a desired distribution for certain AC applications.

FIG. 1(*d*) shows another preferred embodiment of the invention. In FIG. 1(*d*), all of the filaments of superconducting oxide material 132, 134, included in composite article 130 are located at a single cross-sectional radius. A core of non-superconducting material 138 is located within the matrix material 136. The core 138 may be hollow (air filled), or it may comprise a stabilizing material such as copper. In an alternate embodiment, the matrix material, 136, may include a noble metal portion surrounding each filament, 132, 134, but may further comprise a non-noble material in the form of an outer sheath or honeycomb.

Figure 2A:
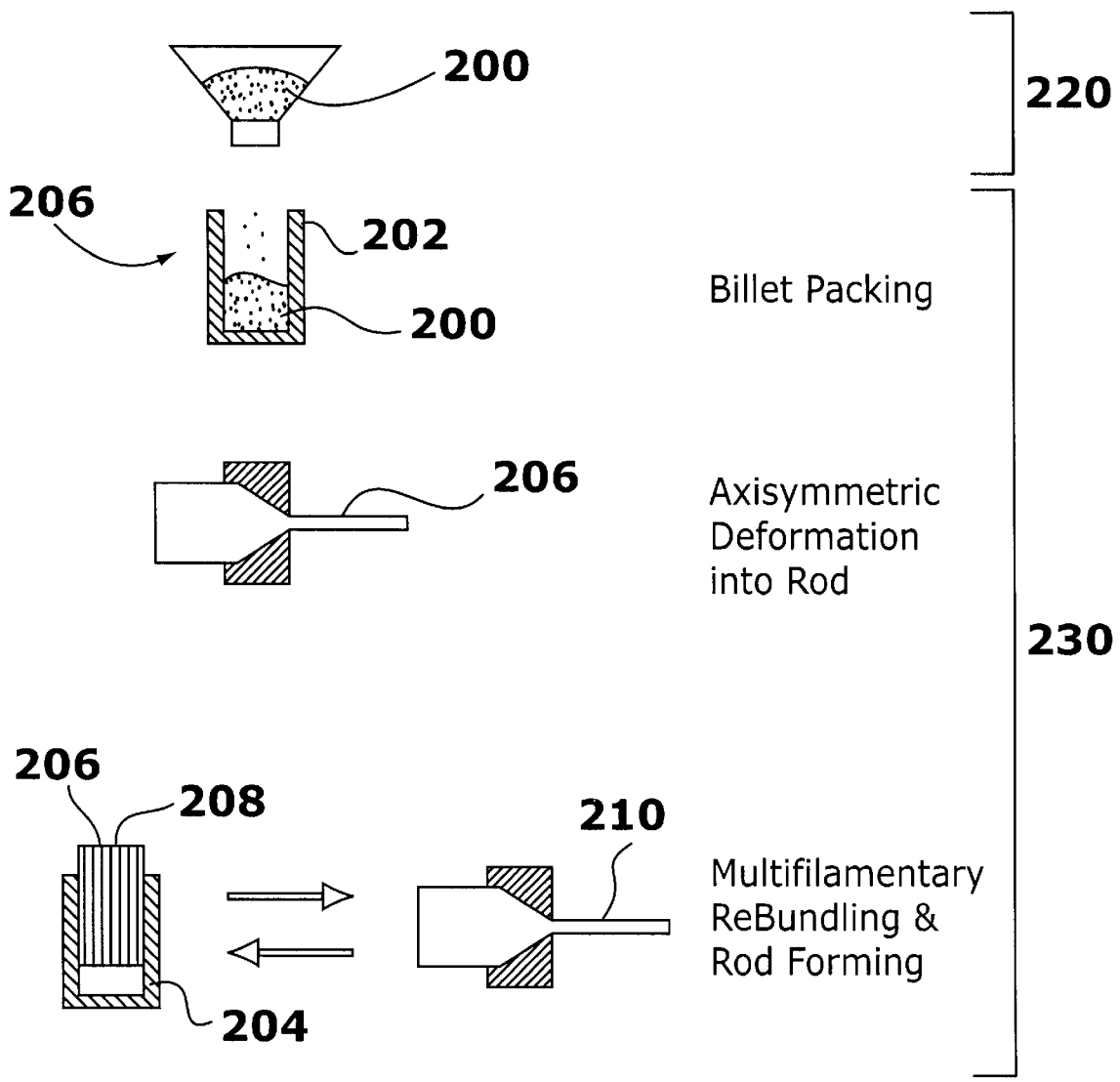
FIG. 2 is a process flow diagram for a powder-in-tube process incorporating the novel torsional texturing technique of the present invention.
Figure 2B:
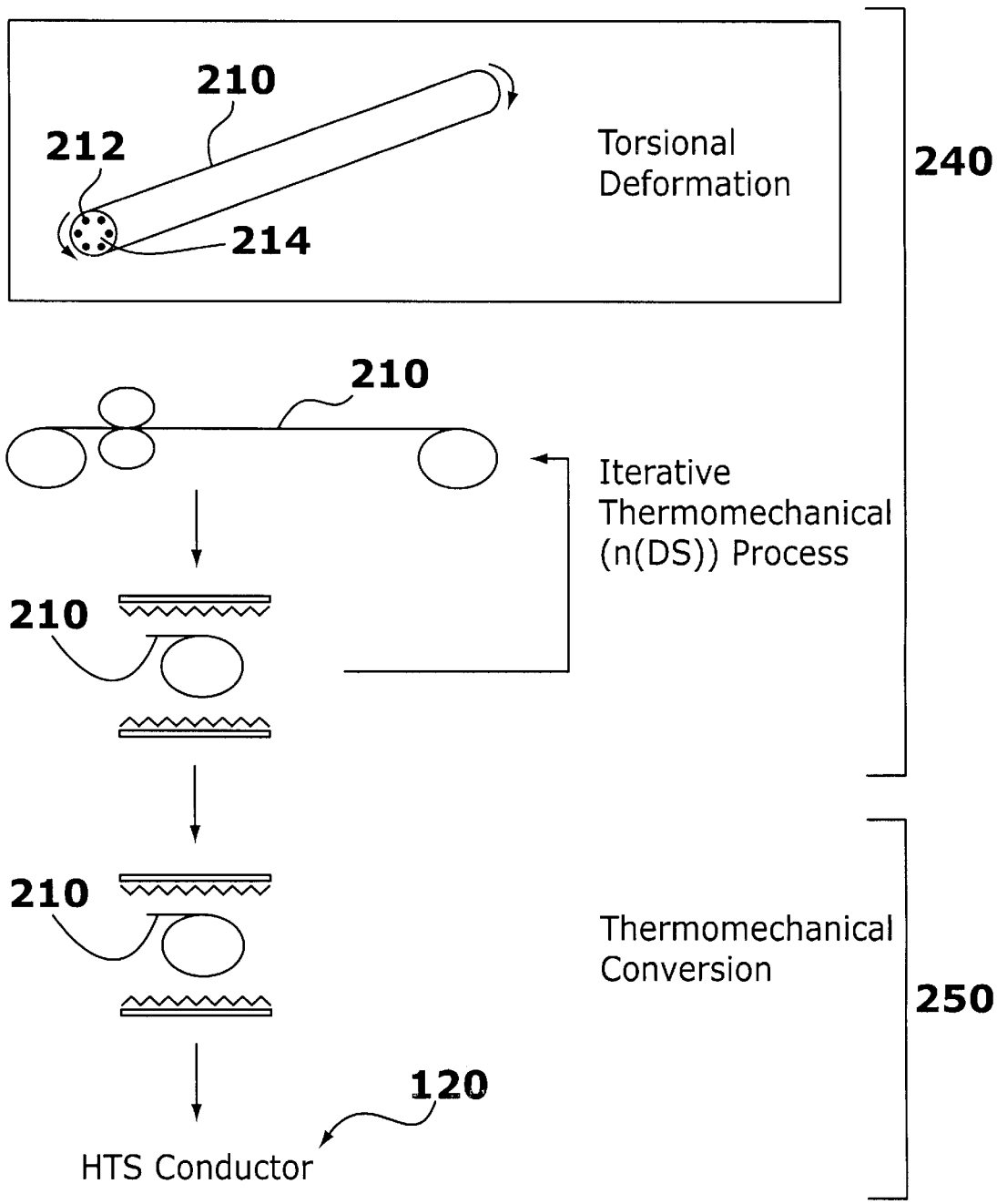

Multifilamentary composite conductors produced using the well-known powder in tube (PIT) techniques are preferred, as they have consistently demonstrated the capability to provide high engineering critical current densities, robust mechanical properties, and long lengths in wires and tapes manufacturable at reasonable cost. However, a variety of other composite processes such as, for example, tape casting, and doctor blade spreading of superconducting oxide powders onto silver tape substrates may also benefit from the torsional deformation processes of the present invention. FIG. 2 shows a process flow diagram for a powder-in-tube process incorporating the novel torsional deformation steps of the present invention. Generally speaking, the PIT process for making HTS composite conductors includes the stages of forming a powder of superconductor precursor material 200, (precursor powder formation stage 220), loading this powder 200 into noble metal containers 202, 204 and deformation processing one or more filled containers 206, 208 by a longitudinal reduction technique to provide a composite 210 of reduced cross-section including one or more filaments of precursor material 206, 208 in intimate contact with a surrounding noble metal matrix 214 (composite precursor fabrication stage 230), thermomechanically processing the composite 210 by some method or combination of methods to obtain the desired texturing in the filament materials 206, 208 (texturing stage 240), and finally further thermomechanically processing the composite 210 (under conditions which partially melt and regrow the filament materials 206, 208 but not the matrix 214) to form and sinter filament material having the desired superconducting properties (thermomechanical conversion stage 250). Multifilamentary composite conductors undergo rebundling operations at one or more points during the precursor fabrication stage. This operation involves assembling filled containers 206, 208 in some close packed or other symmetric arrangement and, typically, inserting the ensemble into a metal tube 204, followed by further longitudinal reductions. The general PIT process is described, for example, in U.S. Pat. Nos. 4,826,808, and 5,189,009 to Yurek et al. and W. Gao & J. Vander Sande, *Superconducting Science and Technology*, Vol. 5, pp. 318–326, 1992, which teach the use of a metal alloy precursor having the same metal content as the desired superconducting oxide, and in C. H. Rosner, M. S. Walker, P. Haldar, and L. R. Motowido, "Status of HTS superconductors: Progress in improving transport critical current densities in HTS Bi-2223 tapes and coils" (presented at conference 'Critical Currents in High Tc Superconductors', Vienna, Austria, April, 1992) and K. Sandhage, G. N. Riley Jr.,. and W. L. Carter, "Critical Issues in the OPIT Processing of High Jc BSCCO Superconductors", *Journal of Metals*, 43,21,19, which teach the use of either a mixture of powders of the oxide components of the superconductor or of a powder having the nominal composition of the superconductor, all of which are herein incorporated by reference. The texturing techniques employed in stage 240 have typically been one or more of the known DIT and RIT techniques described earlier, such as rolling, pressing or melt textured growth. However, the torsional texturing technique of the present invention may advantageously be employed in stage 240, alone or in combination with certain of the known methods.

It should be noted that, because the size and composition of the filament cores change significantly in the course of the PIT process, particularly with respect to multifilamentary composites, similar manufacturing operations performed at different stages of the PIT process will have very different microscopic effects. Thus, the composite 210 may be heat treated at any stage of the process, but in the precursor fabrication stage 230, the primary purpose of any heat treatment is to counteract the work hardening of matrix material caused by the deformation steps, whereas heat treatments intermediate with or subsequent to deformation steps may be used at the later stages 240 and 250 to produce at least one of the effects of forming the desired superconducting phase in the core material, promoting texturing or crack healing, and achieving proper oxygenation of the composite. Longitudinal deformations which take place early in the precursor fabrication stage 230 provide only minimal texture improvements, but during the texturing stage 240, longitudinal deformations of fine filaments may provide the primary texturing mechanism for highly micaceous materials such as BSCCO. However, in *Effect of thermomechanical treatment on the critical current density of Ag-sheathed B(Pb)SCCO tapes, Supercond. Sci. Technol.* 3, 143–147 (1990), Osamura, Oh and Ochiai report that excessive longitudinal deformation of textured material, particularly after the thermomechanical conversion process has begun, may adversely affect texturing. Similarly, twisting a multifilamentary article which has already been highly textured by conventional means such as iterative rolling steps, for BSCCO 2223, or melt-textured growth, for BSCCO 2212, would be expected to introduce microcracks which would adversely affect the current carrying capacity of the article. Thus, in adapting the invention for use in the PIT process, it is important that the torsional deformation be applied at the stage and under the conditions which optimize its texturing effect.

Torsional texturing is induced in stage 240 by applying a torsional strain to composite 210 which is at least 0.3 and preferably at least about 0.6, but less than the strain which would cause failure of the composite 210. By failure of the composite, as this term is used herein, is meant breakdown of composite material substantial loss of dimensional uniformity, or failure of the bonds between the filaments and the matrix material. As will be further explained in the Examples, the inventors have found that the appropriate range of torsional strains to be applied for optimal texturing without composite failure will vary with the article's cross-sectional area and its fill factor, which is computed as the ratio of the total cross-sectional area of the filaments to the total cross-sectional area of the article, and is therefor also a function of filament count and filament diameter. Multifilamentary composites having from 5–10,000, but preferably from 25–1,000 filaments, an aspect ratio no higher than about 4:1, and an overall diameter of from 0.005 inch to 0.12 inch (0.125 to 3.00 mm), and preferably 0.02" to 0.06" (0.5 to 1.5 mm), at the time the torsional strain is applied, are preferred. It is preferred that the total strain applied should be sufficient to provide a twist pitch tighter than 5 times the diameter of the article at the time the strain is applied and twist pitches in the range of 1 to 5 times the diameter of the article at the time the strain is applied are most preferred. If tighter twist pitches are desired, the article may be heat treated or annealed and the strain repeated as many times as necessary to obtain the desired twist pitch. For articles with diameters in the preferred range, strains of this magnitude will provide twist pitches in the range of about 0.02 to 0.30 inch (0.50 to 7.5 mm), that is, about 1.00 to 80 twists per inch, at the time the torsional strain is applied. Within the limits of the strain which would cause failure of the composite, the data suggest that higher strains will provide improved texturing. Within the suitable range, other considerations, such as what twist pitch will provide optimal AC loss characteristics in the finished article, may be used to determine the exact strain applied.

Figure 3:
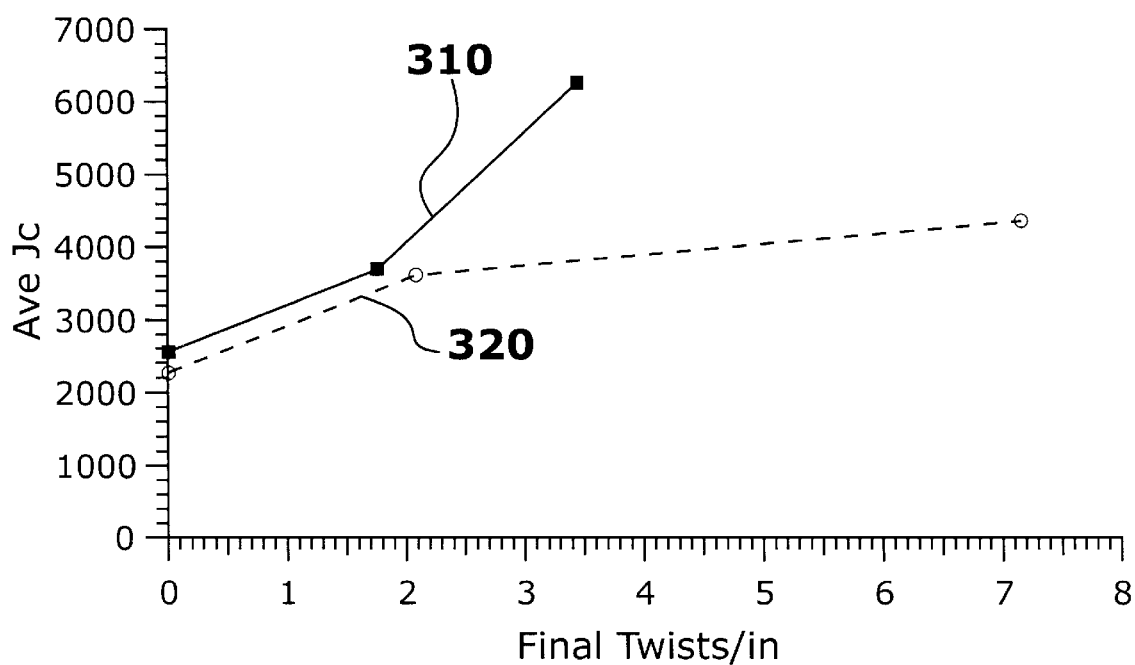
FIG. 3 is a plot of twists/inch (the inverse of twist pitch) vs. critical current density for a series of wires textured in accordance with the invention.

FIG. 3 shows a plot of twists/inch (the inverse of twist pitch) vs. critical current for two series of identical samples textured in accordance with the invention. The samples marked with squares and connected by the solid line 310 were manufactured as described in Example 2 below and the samples marked with circles and connected by the dotted line 320 were manufactured as described in Example 7 below. The applied strain, S, varies linearly with the radius of the wire, r, and inversely with the length twisted, L, in accordance with the formula $S=(r/L)*q$, where q is the twist angle in radians. The critical current of each sample was measured at 77K, using a 1 mV/cm criteria and a 1 cm voltage tap length. The critical currents of the experimental conductors were determined using a four-point probe technique. The critical currents were characterized over a length at least as great as that of the twist pitch so that an entirely representative measure of the superconducting performance was obtained. Digital image analysis (DIA) of polished cross sections was used to determine the cross sectional areas of the superconductor filaments. The critical current density is the critical current divided by this area. It will be seen from line 310 in FIG. 3 that within the fracture tolerance of the composite, increased texturing, as indicated by increasing critical current, is associated in an approximately linear fashion with increased torsional strain.

Torsional strain may be applied in stage 240 by any method which provides control of tension and twist uniformity. Elongated superconducting multifilamentary articles such as those produced in the PIT process may be twisted on conventional twisting equipment, for example, on a lathe, on one of the machines designed for twisting copper or low temperature superconducting wire or cable, such as those used by Supercon, Inc of Shrewsbury, Mass., or on "Buncher" or "Bow Twister" machines, such as those manufactured by Machinery International Inc. of Paterson, N.J. or Bartall Machinery Systems Group of Rochester, N.Y. Both these machines employ a basic process very similar to that used in a spinning wheel to twist yarn, and are used to fabricate steel cord for radial automobile tires and textile fibers, respectively. Tension can be controlled on a payoff spool, and the uniformity of twist can be controlled by keeping the portion of the length actually being twisted low, preferably on the order of a meter or less, for articles in the preferred diameter ranges. Preferably, the twisting will be done as the article is being drawn through a die, where the twisting stops and a slight longitudinal deformation may be used to lock in the twist. It is preferred that the composite be annealed after each torsional deformation to reduce the dislocation density within the silver and restore some level of ductility to the composite precursor. For PIT wires of the general compositions and dimensions indicated above, heating in the range of about 200–550 C for 10 minutes to 2 hours in 0.001% to 1 atm oxygen will provide the desired anneal. If an ultimate twist pitch greater than the maximum per step strain specified above is desired, the twist-anneal sequence may be repeated to obtain the desired twist pitch.

Torsional deformation has been found to effectively texture PIT composites when used alone or in combination with certain other conventional texturing techniques. Preferably, as shown in FIG. 2, the composite 210 is textured in stage 240 by applying a sequence of separate texturing steps including both torsional strains and conventional texturing techniques selected from the set including axisymmetric longitudinal deformation, isostatic pressing, roller straightening, and RIT techniques dependent on partial melting. Any conventional technique which does not eliminate prior texturing or substantially change the aspect ratio of the article may be used. Preferably, at least one torsional deformation step precedes the first conventional texturing step. If an RIT texturing step is to follow the torsional deformation step, the back anneal may be omitted. The combination has been found to be most effective when at least one torsional deformation step precedes at least one axisymmetric longitudinal deformation step, and heat treatments sufficient to induce RIT and phase transformation in remaining precursor materials are alternated with these. Drawing is a preferred form of axisymmetric longitudinal deformation and a 5–30% area reduction in one or more successive iterations is preferred. For example, two draw steps with a reduction of 10% per step may be used. In the most preferred embodiment, one or more successive iterations of torsional and axisymmetric longitudinal deformation may be used, and heat treatments sufficient to produce RIT, phase transformation of precursors, or both, in the filament material are most preferably done after each deformation step except the last. As shown in the examples below, this combination of steps provides significantly better texturing than an equal number of iterations of purely torsional or axisymmetric longitudinal deformation used with the same heat treatments, and also better texturing than the reversed sequence.

In manufacturing the preferred BSCCO 2223 composite of the present invention, precursor powders and composites may be formed using one of the standard PIT techniques. For example, nitrate powders may be packed in standard silver billets, and extrusion and wire-drawing may be used to form hexagonal monofilamentary rods. A plurality of these rods may be assembled in a close-packed manner and inserted into silver tubes resulting in composite precursors with the desired filament counts, including from 6 to 10,000 filaments, and most preferably in the range of 50–1000.

Filaments with a low aspect ratio, preferably less than about 4:1, and fill factors over 0.1, are preferred. Wire-drawing may be used to reduce the diameters of the respective precursors to values in the range of from 0.01 inch to 0.12 inch (0.5 to 3 mm), and preferably 0.02 inch to 0.06 inch (0.5 to 1.5 mm) prior to the initial torsional deformation step. In accordance with the invention, the composite may be twisted to a strain of at least 0.6 per step, but less than the strain which would cause failure of the composite. Strains of this magnitude will provide twist pitches in the range of about 1.00 inch to 0.01 inch (25 to 0.25 mm), that is, about 1.00 to 80 twists per inch, for articles with diameters in the preferred range of 0.005 inch to 0.12 inch (0.13 to 3 mm) at the time the torsional strain is applied. If tighter twist pitches are desired, the article may be annealed at 200–550 C for 10 minutes to 2 hours in 0.001% to 1 atm oxygen and the strain repeated as many times as necessary to obtain the desired twist pitch. It is preferred that the strain applied per step should be sufficient to provide a twist pitch tighter than 5 times the diameter of the article, and twist pitches in the range of 1 to 5 times the diameter of the article are most preferred. The precursor may then be heat treated at 800–850 C for 1–100 hours at 2–10% oxygen atmosphere. Preferably, it will then be drawn to obtain a 5–30% area reduction in one or more successive iterations If multiple deformations are performed, intermediate anneals will preferably be performed in between. Then a final heat treatment will be performed in a 7.5% oxygen atmosphere at 828 to 832 C for 20 to 80 hours, 805 to 815 C for 1 to 240 hours and 787 to 795 C for 10 to 50 hours to form and sinter the desired 2223 material in the filament cores.

Figure 4A:
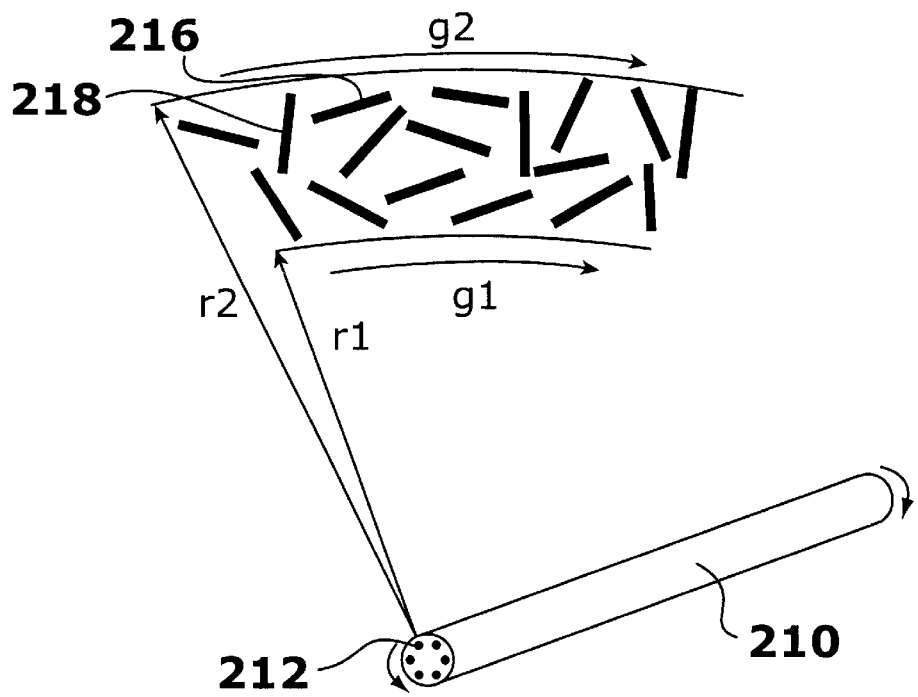
FIGS. 4(a) and (b) are schematic diagrams of enlarged cross-sections of a composite wire showing grain orientations before and after texturing in accordance with the invention.
Figure 4B:
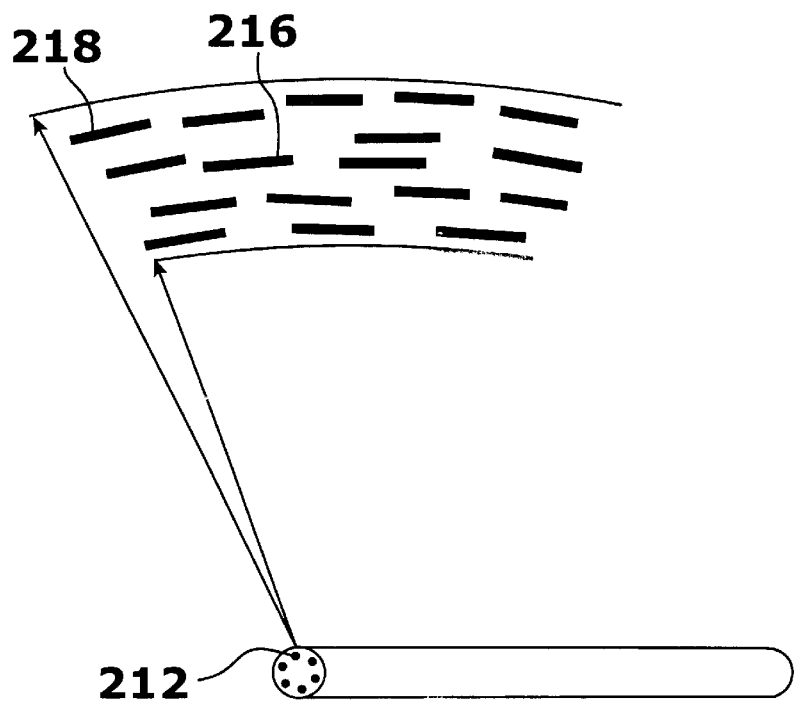

FIGS. 4(a) and (b) are schematic diagrams of enlarged cutaway cross-sections of a filament showing grain orientations before and after texturing in accordance with the invention. As shown in FIGS. 4(a) and (b), composite 210 includes filament 212 comprising grains 216, 218 of a micaceous or semi-micaceous material, which may be a desired superconducting oxide or its precursors. In FIG. 4(a), the grains 216, 218 are aligned randomly in the untwisted filament, 212. Although the inventors do not wish to be constrained by any theory, they believe that the torsional strain applied in twisting the composite creates compression forces similar to those applied in wringing a wet towel. They believe that these compression forces tend to align the c-axes of the oxide grains 216, 218 parallel to the maximum compression vector.

The invention may be further understood from the following examples:

EXAMPLE 1

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.422 inch (1.07 cm) and a length of 5 inch (12.7 cm) and an outer diameter of 0.615 inch (1.56 cm) to form a billet.

The billets were extruded to a diameter of 0.25 inch (0.63 cm). The billet diameter was narrowed with multiple die steps, with a final step drawn through a 0.55 inch(1.4 cm) hexagonally shaped die into a silver/precursor hexagonal wires. Eighty-five of the wires were bundled together, put in a silver sheath having an inner diameter of 0.600 inch (1.52 cm) and an outer diameter of 0.72 inch (1.83 cm) to form a billet, and drawn to .0.046 inch (0.12 cm) to form a multifilamentary round wire, which was then divided longitudinally into 3 parts.

The first part was drawn to 0.042 inch (0.11 cm) and heat treated at 815 C in a 7.5% oxygen atmosphere for 20 hours. It was then further drawn to 0.037 inch (0.09 cm), heat treated at 815 C in a 7.5% oxygen atmosphere for 20 hours, and twisted to 5 twists/inch, or 1.97 twists/cm (a strain of 0.58) using a hand drill, and a final heat treatment was performed in a 7.5% oxygen atmosphere at 830 C for 40 hours, 811 C for 120 hours and 787 C for 30 hours to form and sinter the desired 2223 material in the filament cores. The resulting sample had a final twist pitch of 0.2 inch or 5.08 mm (5 twists per inch, or 2 twists/cm).

The second part was not twisted before it was heat treated at 815 C in a 7.5% oxygen atmosphere for 20 hours. It was then drawn to 0.042 inch (0.11 cm), heat treated at 815 C in a 7.5% oxygen atmosphere for 20 hours, further drawn to 0.037 inch (0.09 cm) and a final heat treatment was performed in a 7.5% oxygen atmosphere at 830 C for 40 hours, 811 C for 120 hours and 787 C for 30 hours to form and sinter the desired 2223 material in the filament cores.

The third part was annealed at 450 C for 1 hour in air, twisted to 3 twists/inch, or 1.18 twists/cm (a strain of 0.35) using a hand drill, and heat treated at 815 C in a 7.5% oxygen atmosphere for 20 hours. It was then drawn to 0.042 inch (0.11 cm), heat treated heat treated at 815 C in a 7.5% oxygen atmosphere for 20 hours, further drawn to 0.037 inch (0.09 cm) and a final heat treatment was performed in a 7.5% oxygen atmosphere at 830 C for 40 hours, 811 C for 120 hours and 787 C for 30 hours to form and sinter the desired 2223 material in the filament cores. The resulting sample had a final twist pitch of 0.5 inch or 12.7 mm (2 twists per inch, or 0.79 twists/cm).

After the final heat treatment, the critical current of each part was measured at 77K, using a 1 $\mu$V/cm criteria and a 1 cm voltage tap length. The critical currents of the experimental conductors were determined using a four-point probe technique. The critical currents were characterized over a length at least as great as that of the twist pitch so that an entirely representative measure of the superconducting performance was obtained. Engineering critical current densities were calculated for both samples as the measured critical current divided by the cross-sectional area of the wire. The first, drawn then twisted sample had an engineering critical current density of 610, while the untwisted, drawn sample had an engineering critical current density of 709. The third, twisted then drawn sample had an engineering critical current density of 1032, a significant improvement.

EXAMPLE 2

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (13.97 cm) and an outer diameter of 1.25 inch (3.18 cm) to form a billet. The billets were extruded to a diameter of ½ inch (1.27 cm). The billet diameter was narrowed with multiple die steps, with a final step drawn through a 0.70 inch (0.178 cm) hexagonally shaped die into a silver/precursor hexagonal wires. Eighty-five of the wires were bundled together and drawn to 0.032 inch (0.08 cm) to form a multifilamentary round wire, which was then annealed at 450 C for 1 hour in air.

The sample was twisted to 9 twists/inch, or 3.6 twists/cm, (a total strain of 0.9) by two successive iterations of twisting to 3 twists/inch or 1.18 twists/cm (a per step strain of 0.3) on a custom designed twister known as the "little twister" leased from Supercon, Inc. of Shrewsbury, Mass. followed by an anneal at 450 C for 1 hour in air and a third iteration of 3 twists/inch or 1.18 twists/cm (a per step strain of 0.3) on a hand drill. It was then drawn through a 0.030 inch (0.08 cm) die. It was then heat treated at 815 C in a 7.5% oxygen atmosphere for 20 hours. It was then drawn to 0.027 inch (0.69 cm), heat treated at 815 C in a 7.5% oxygen atmosphere for 20 hours, further drawn to 0.025 inch (0.64 cm) and a final heat treatment was performed in a 7.5% oxygen atmosphere at 830 C for 40 hours, 811 C for 120 hours and 787 C for 30 hours to form and sinter the desired 2223 material in the filament cores. The resulting sample had a final twist pitch of 0.12 inch (0.31 cm).

A second sample was prepared in the same manner, but without the twisting steps.

After the final heat treatment, the critical current of each sample was measured at 77K, using a 1 $\mu$V/cm criteria and a 1 cm voltage tap length. The critical currents of the experimental conductor was determined using a four-point probe technique. The critical current was characterized over a length at least as great as that of the twist pitch so that an entirely representative measure of the superconducting performance was obtained. Engineering critical current densities were calculated as the measured critical current divided by the cross-sectional area of the wire. The untwisted sample had an engineering critical current density of 701 A/cm$^2$, very nearly the same as the untwisted sample from example 1. The twisted sample had an engineering critical current density of 1930 A/cm$^2$. As will be seen by comparison of example 2 with example 1, part 3, which used the same texturing sequence, higher twist pitches were associated with higher engineering critical current densities.

EXAMPLE 3

Figure 5A:
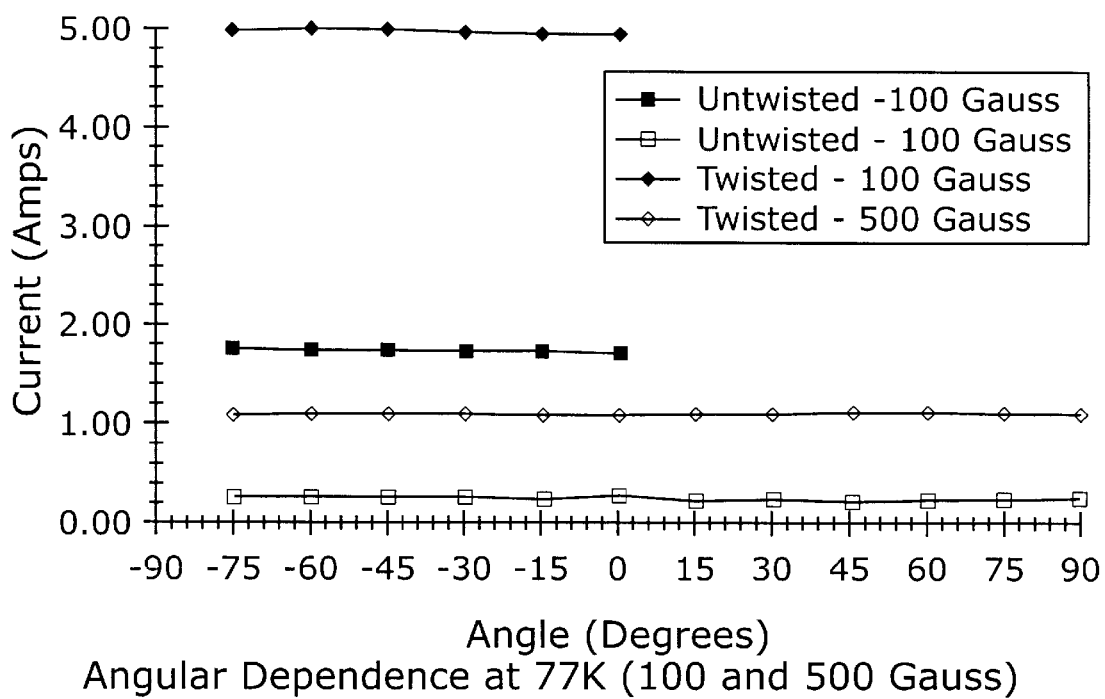
FIG. 5(a) is a plot of the angular field dependence at 77 K in 100 and 500 gauss fields for a wire textured in accordance with the invention and for an untwisted wire.

Two samples of round wire—one twisted and one untwisted—were made in accordance with Example 2. The samples were mounted on a probe which was then placed inside the sample tube of a variable temperature cryostat. Since these tests were all performed at 77 K, the sample tube was filled with liquid nitrogen. The first test involved measuring the angular dependence at two magnetic field values—100 and 500 Gauss. These results are plotted in FIG. 5(a).

Figure 5B:
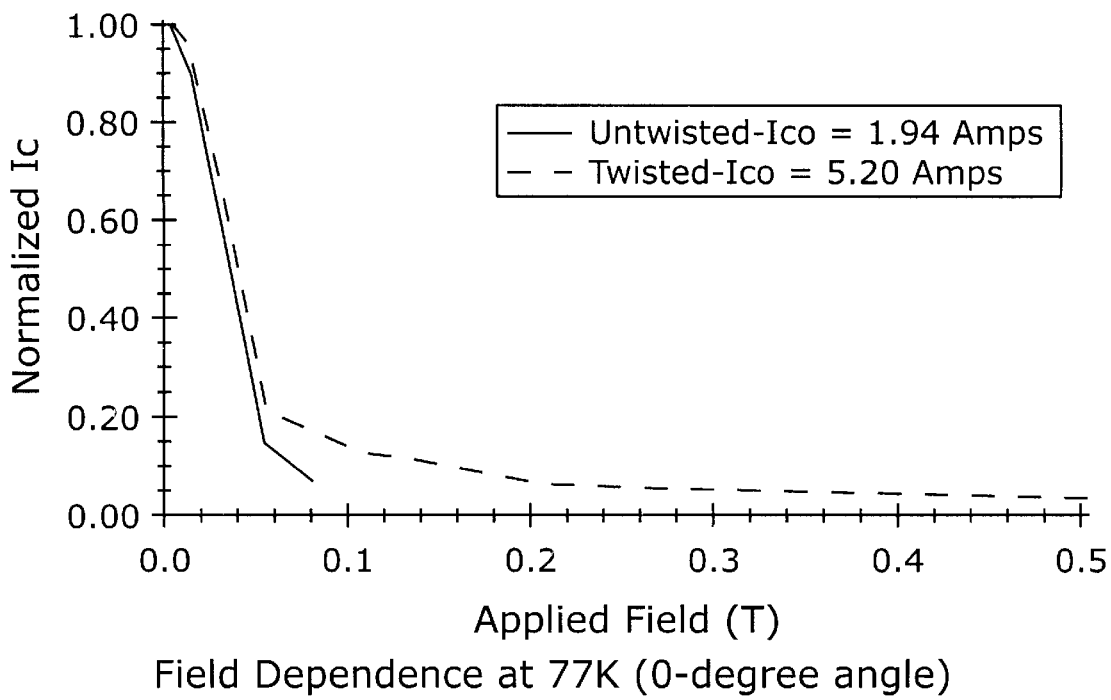
FIG. 5(b) is a plot of field dependence at 77 K at a 0 degree angle for these same wires.

Next, with the angle arbitrarily held constant at 0 degrees, the field dependence was also measured at 0.075, 0.10, 0.20 and 0.50 Tesla. Combining these data with the previous 0-degree angle measurements at 0, 0.01 and 0.05 Tesla, a plot of the field dependence was obtained and plotted in FIG. 5(b). Both the twisted and untwisted round wires show performance which is substantially independent of field orientation. However, the twisted wire shows superior critical current density retention characteristics in an applied field.

EXAMPLE 4

The appropriate range of torsional strains to be applied for optimal texturing has been found to vary with the article's cross-sectional area and fill factor, which is computed as the ratio of the total cross-sectional area of the filaments to the total cross-sectional area of the article, and is therefor a function of filament count and filament diameter. A number of samples of varying diameters and fill factors were strained to failure to empirically determine the impacts of these two variables. Texturing is induced by applying a torsional strain which is preferably at least about 0.3 and preferably at least about 0.6, but less than the strain which would cause failure of the composite.

| Diameter Tested | Fill Factor | Strain |
|---|---|---|
| .053" | 0 | 5.66 |
| .053" | 0.24 | 2.75 |
| .074" | 0.24 | 2.67 |
| .051" | 0.24 | 2.5 |
| .074" | 0.24 | 2.03 |
| .074" | 0.28 | 1.85 |
| .033" | 0.28 | 1.97 |
| .053" | 0.28 | 1.83 |
| .102" | 0.28 | 1.92 |
| .070" | 0.33 | 1.43 |

These tests suggested that wires with a fill factor of about 0.28 tended to fail at a total strain per step, measured at the surface of the wire, of about 2. Using this information and the formula, $T_{max}=2\pi r/S_{max}$, where r is the wire diameter, $T_{max}$ is the maximum number of twists per inch achievable per step and $S_{max}$ is the strain per step at composite failure.

| r | $T_{max}$ |
|---|---|
| 0.01 | 63.69427 |
| 0.015 | 42.46285 |
| 0.02 | 31.84713 |
| 0.025 | 25.47771 |
| 0.03 | 21.23142 |
| 0.035 | 18.19836 |
| 0.04 | 15.92357 |
| 0.045 | 14.15428 |
| 0.05 | 12.73885 |
| 0.055 | 11.58078 |
| 0.06 | 10.61571 |
| 0.065 | 9.799118 |
| 0.07 | 9.099181 |
| 0.075 | 8.492569 |

EXAMPLE 5

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20 cm) and an outer diameter of 1.25 inch (3.18 cm) to form a billet. The billets were extruded to a diameter of ½ inch (1.27 cm). The billet diameter was narrowed with multiple die steps, with a final step drawn through a 0.70 inch (1.78 cm) hexagonally shaped die into a silver/precursor hexagonal wires. Eighty-five of the wires were bundled together and drawn to 0.032 inch (0.08 cm) to form a multifilamentary round wire, which was then annealed at 450 C for 1 hour in air.

The sample was twisted to 5 twists/inch as measured on the exit end of the die, or 1.97 twists/cm (a strain of 0.5) using a custom twisting machine known as the "big twister" leased from Supercon, Inc. of Shrewsbury, Mass. and drawing through a 0.030 inch (0.08 cm) die.

EXAMPLE 6

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.765 inch (1.94 cm) and a length of 8 inches (20 cm) and an outer diameter of 1.25 inch (3.18 cm) to form a billet. The billets were extruded to a diameter of ½ inch (1.27 cm). The billet diameter was narrowed with multiple die steps, with a final step drawn through a 0.70 inch (1.78 cm) hexagonally shaped die into a silver/precursor hexagonal wires. 85 of the wires were bundled together, packed into a silver sheath having an inner diameter of 0.760 inch (1.78 cm) and an outer diameter of 0.84 inch (2.13 cm) to form a billet, and drawn to 0.051 inch (0.13 cm) to form a multifilamentary round wire, which was then annealed at 450 C for 1 hour in air.

The sample was twisted to 11 twists/inch, or 4.33 twists/cm (a strain of 1.17) using a lathe and drawing through a 0.046 inch (0.12 cm) die.

EXAMPLE 7

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20 cm) and an outer diameter of 1.25 inch (3.18 cm) to form a billet. The billets were extruded to a diameter of 0.50 inch (1.27 cm). The billet diameter was narrowed with multiple die steps, with a final step drawn through a 0.55 inch (1.4 cm) hexagonally shaped die into a silver/precursor hexagonal wires. Eighty-five of the wires were bundled together, packed into a silver sheath having an inner diameter of 0.760 inch (1.78 cm) and an outer diameter of 0.84 inch (2.13 cm) to form a billet and drawn to 0.102 inch (0.26 cm) to form a multifilamentary round wire.

The first part was drawn to 0.051 inch (0.13 cm) in a series of 10% reduction (computed as a reduction of the cross-sectional area) steps. Every second reduction step was followed by a 1 hour anneal in air at 450 C. It was then twisted to 10 twists/inch, or 4 twists/cm (a strain of 1.6) using a hand drill and heat treated at 815 C in a 7.5% oxygen atmosphere for 20 hours. It was further drawn to 0.046 inch (0.12 cm) in two 10% reduction steps, heat treated at 815 C in a 7.5% oxygen atmosphere for 20 hours, further drawn to 0.042 inch (0.11 cm) in two 10% reduction steps, and a final heat treatment was performed in a 7.5% oxygen atmosphere at 830 C for 40 hours, 811 C for 120 hours and 787 C for 30 hours to form and sinter the desired 2223 material in the filament cores. The resulting sample had a final twist pitch of 0.15 inch or 3.7 mm (6.8 twists per inch, or 2.7 twists/cm).

After the final heat treatment, the critical current of each sample was measured at 77K, using a 1 $\mu$V/cm criteria and a 1 cm voltage tap length. The critical currents of the experimental conductor was determined using a four-point probe technique. The critical current was characterized over a length at least as great as that of the twist pitch so that an entirely representative measure of the superconducting performance was obtained. Engineering critical current densities were calculated as the measured critical current divided by the cross-sectional area of the wire. The twisted sample had an engineering critical current density of 722 $A/cm^2$.

EXAMPLE 8

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20 cm) and an outer diameter of 1.25 inch (3.18 cm) to form a billet. The billets were extruded to a diameter of 0.50 inch (1.27 cm). The billet diameter was narrowed with multiple die steps, with a final step drawn through a 0.55 inch (1.4 cm) hexagonally shaped die into a silver/precursor hexagonal wires. Eighty-five of the wires were bundled together, packed into a silver sheath having an inner diameter of 0.760 inch (1.78 cm) and an outer diameter of 0.84 inch (2.13 cm) to form a billet and drawn to 0.102 inch (0.26 cm) to form a multifilamentary round wire.

The first part was annealed at 450 C for an hour in air and twisted to 3 twists/inch, or 1.18 twists/cm (a strain of 0.94) using a hand drill, drawn to 0.091 inch (0.21 cm) in 10% reduction (computed as a reduction of the cross-sectional area)steps, and annealed at 450 C for an hour in air. It was further twisted to 3 twists/inch, or 1.18 twists/cm (a strain of 0.86) using a hand drill, drawn to 0.082 inch (0.21 cm) and annealed at 450 C for an hour in air, twisted to 3 twists/inch, or 1.18 twists/cm (a strain of 0.8) using a hand drill. It was then drawn in an additional series of five 10% reduction passes to 0.051 inch (0.13 cm) and heat treated at 815 C in a 7.5% oxygen atmosphere for 20 hours. It was then further drawn to 0.046 inch (0.12 cm) in two 10% reduction steps, heat treated at 815 C in a 7.5% oxygen atmosphere for 20 hours, further drawn to 0.042 inch (0.11 cm) in two 10% reduction steps, and a final heat treatment was performed in a 7.5% oxygen atmosphere at 830 C for 40 hours, 811 C for 120 hours and 787 C for 30 hours to form and sinter the desired 2223 material in the filament cores. The resulting sample had a final twist pitch of 0.14 inch or 3.4 mm (7.4 twists per inch, or 2.9 twists/cm).

After the final heat treatment, the critical current of each sample was measured at 77K, using a 1 $\mu$V/cm criteria and a 1 cm voltage tap length. The critical currents of the experimental conductor was determined using a four-point probe technique. The critical current was characterized over a length at least as great as that of the twist pitch so that an entirely representative measure of the superconducting performance was obtained. Engineering critical current densities were calculated as the measured critical current divided by the cross-sectional area of the wire. The twisted sample had an engineering critical current density of 1250 A/cm$^2$.

The various features and advantages of the invention may be seen from the foregoing description. Iterative variations on the processes described above, such as changes in the parameters, number and order of the torsional and conventional texturing steps will be seen to be within the scope of the invention. Many modifications and variations in the preferred embodiments illustrated will undoubtedly occur to those versed in the art, as will various other features and advantages not specifically enumerated, all of which may be achieved without departing from the spirit and scope of the invention as defined by the following claims.

What is claimed is:

1. A method of texturing a multifilamentary superconducting article having filaments comprising a desired oxide superconductor or its precursors and a reinforcing member, comprising:

torsionally deforming the article to texture the filaments comprised therein; and further processing the torsionally textured article to obtain an oxide superconducting article under conditions which are not deleterious to existing torsionally-induced texture, wherein the filaments comprise a desired oxide superconductor or precursor selected to have a micaceous or semi-micaceous structure.

2. A method according to claim 1 wherein the article further comprises a noble metal matrix in intimate contact with said filaments.

3. A method according to claim 2 wherein the texturing is induced by applying a torsional strain which is at least about 0.3 and preferably at least about 0.6, but less than the strain which would cause failure of the article.

4. A method according to claim 1 wherein the article possesses a round cross-section and wherein each filament possesses a low aspect ratio.

5. A method according to claim 3 wherein the filaments comprise a desired superconducting oxide and the article is heat treated after being torsionally deformed under conditions sufficient to produce at least one of the effects of reaction induced texturing and crack healing in the filaments.

6. A method according to claim 3 wherein the filaments comprise the precursors of a desired superconducting oxide and the article is heat treated after being torsionally deformed under conditions sufficient to produce at least one of the effects of phase transformation to the desired superconducting oxide, reaction induced texturing and crack healing in the filaments.

7. A method according to claim 3 wherein the article is textured by applying a sequence of separate texturing steps including both torsional strains and conventional texturing techniques selected from the set including axisymmetric longitudinal deformation, isostatic pressing or roller straightening and RIT techniques dependent on partial melting.

8. A method according to claim 7 wherein a torsional deformation step precedes a conventional texturing step.

9. A method according to claim 8 including an axisymmetric longitudinal deformation step.

10. A method according to claim 8 including an RIT step.

11. A method according to claim 8 including an isostatic pressing or a roller straightening step.

12. A method according to claim 9 wherein the article is heat treated under conditions sufficient to produce RIT, phase transformation of precursors, or both, in the filament material after the torsional deformation step and before the axisymmetric longitudinal deformation step.

13. A method according to claim 12 wherein the article is textured by a plurality of torsional deformation steps and axisymmetric longitudinal deformation steps, and wherein heat treatments sufficient to produce RIT, phase formation of precursors, or both, in the filament material are performed after each deformation step.

14. A method according to claim 8 wherein the filaments comprise BSCCO 2223 or its precursors.

15. A method according to claim 14 wherein the total torsional strain applied is sufficient to provide a per step twist pitch tighter than about 5 times the diameter of the multifilamentary article at the time the strain is applied.

16. A method according to claim 15 wherein the torsional strain applied is sufficient to provide a per step twist pitch in the range of 1 to 5 times the diameter of the multifilamentary article at the time the strain is applied.

17. The method of claim 1 further comprising the steps of:

thermomechanically processing the composite at conditions sufficient to produce at least one of the effects of RIT, crack healing and, if a precursor material remains, phase transformation in the filament material, wherein the thermal processing is conducted at a pressure no greater than about atmospheric.

18. A process according to claim 17 wherein the composite further comprises a noble metal matrix in intimate contact with said filaments.

19. A process according to claim 18 wherein the texturing is induced in one or more steps by applying a torsional strain per step which is at least about 0.3 and preferably at least about 0.6, but less than the strain which would cause failure of the composite.

20. A method according to claim 19 wherein the composite possesses a round cross-section and wherein each filament possesses a low aspect ratio.

21. A process according to claim 19 wherein the filaments comprise a desired superconducting oxide and wherein the thermomechanical processing is under conditions sufficient to produce at least one of the effects of RIT and crack healing in the filament material.

22. A process according to claim 19 wherein the filaments comprise the precursors of a desired superconducting oxide and wherein the thermomechanical processing is under conditions sufficient to produce at least one of the effects of phase transformation to the desired superconducting oxide, reaction induced texturing and crack healing in the filaments.

23. A process according to claim 19 further comprising conventional texturing techniques selected from the set including axisymmetric longitudinal deformation, isostatic pressing or roller straightening and RIT techniques dependent on partial melting.

24. A process according to claim 23 wherein a torsional deformation step precedes a conventional texturing step.

25. A process according to claim 24 including an axisymmetric longitudinal deformation step.

26. A process according to claim 24 including an RIT step.

27. A process according to claim 24 including an isostatic pressing or a roller straightening step.

28. A process according to claim 25 wherein the composite is heat treated under conditions sufficient to produce RIT, phase transformation of precursors, or both, in the filament material after the torsional deformation step and before the axisymmetric longitudinal deformation step.

29. A process according to claim 24 wherein the article is textured by a plurality of torsional deformation steps and axisymmetric longitudinal deformation steps, and wherein heat treatments sufficient to produce RIT, phase transformation of precursors, or both, in the filament material are performed after each deformation step except the last.

30. A process according to claim 29 wherein the filaments comprise BSCCO 2223 or its precursors.

31. A process according to claim 30 wherein the torsional strain applied per step is sufficient to provide a twist pitch tighter than 5 times the diameter of the composite.

32. A process according to claim 31 wherein the torsional strain applied per step is sufficient to provide a twist pitch in the range of about 1 to 5 times the diameter of the composite.

33. The method of claim 1 or 17, wherein the texturing is induced by applying a total torsional strain which is at least about 0.9, but less than the strain which would cause failure of the article.

34. The method of claim 33 wherein the total torsional strain is applied stepwise.

* * * * *